(12) United States Patent
Ingersoll et al.

(10) Patent No.: US 6,991,984 B2
(45) Date of Patent: Jan. 31, 2006

(54) METHOD FOR FORMING A MEMORY STRUCTURE USING A MODIFIED SURFACE TOPOGRAPHY AND STRUCTURE THEREOF

(75) Inventors: Paul A. Ingersoll, Austin, TX (US); Gowrishankar L. Chindalore, Austin, TX (US); Ramachandran Muralidhar, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/765,804

(22) Filed: Jan. 27, 2004

(65) Prior Publication Data

US 2005/0161731 A1   Jul. 28, 2005

(51) Int. Cl.
*H01L 21/336* (2006.01)
(52) U.S. Cl. .................................. 438/257
(58) Field of Classification Search ........ 438/257–267; 257/314–320, E21.179, E21.422, E21.68, 257/E21.681, E21.683, E21.686; 977/DIG. 1
See application file for complete search history.

(56) References Cited

U.S. PATENT DOCUMENTS

| 3,878,549 | A | 4/1975 | Yamazaki |
| 6,413,819 | B1 | 7/2002 | Zafar |
| 6,574,144 | B2 | 6/2003 | Forbes |
| 6,611,019 | B2 | 8/2003 | Rudeck |
| 6,656,792 | B2 * | 12/2003 | Choi et al. .................. 438/257 |
| 6,690,059 | B1 * | 2/2004 | Lojek .......................... 257/316 |
| 6,740,928 | B2 * | 5/2004 | Yoshii et al. ............... 257/315 |
| 6,844,231 | B2 * | 1/2005 | Kim et al. ................. 438/257 |
| 2003/0234420 | A1 * | 12/2003 | Forbes ....................... 257/315 |
| 2003/0235064 | A1 * | 12/2003 | Batra et al. ................ 365/100 |

OTHER PUBLICATIONS

Watanabe et al., "An Advanced Technique for Fabricating Hemispherical-Grained (HSG) Silicon Storage Electrodes," IEEE Transactions on Electron Devices, vol. 42, No. 2, Feb. 1995, pp. 295-300.
De Blauwe et al., "A Novel, Aerosol-Nanocrystal Floating-Gate Device for Non-Volatile Memory Applications," IEEE, pp. 29.7.1-29.7.4 (2000).

* cited by examiner

*Primary Examiner*—Brook Kebede
(74) *Attorney, Agent, or Firm*—Kim-Marie Vo; Joanna G. Chiu

(57) ABSTRACT

To increase the gate coupling ratio of a semiconductor device 10, discrete elements 22, such as nanocrystals, are deposited over a floating gate 16. In one embodiment, the discrete elements 22 are pre-formed in a vapor phase and are attached to the semiconductor device 10 by electrostatic force. In one embodiment, the discrete elements 22 are pre-formed in a different chamber than that where they are attached. In another embodiment, the same chamber is used for the entire deposition process. An optional, interfacial layer 17 may be formed between the floating gate 16 and the discrete elements 22.

27 Claims, 4 Drawing Sheets

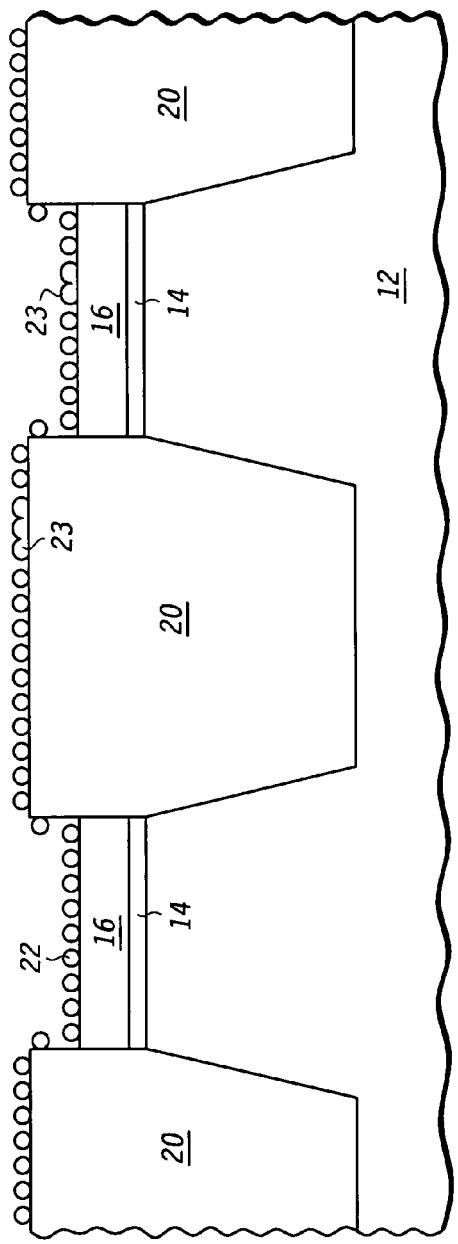
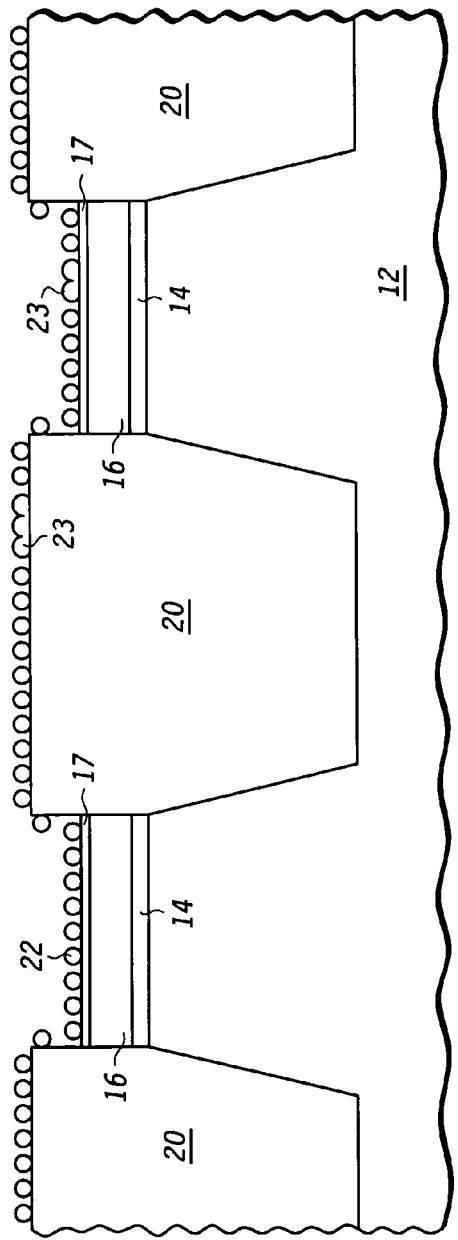

METHOD FOR FORMING A MEMORY STRUCTURE USING A MODIFIED SURFACE TOPOGRAPHY AND STRUCTURE THEREOF

FIELD OF THE INVENTION

This invention relates generally to semiconductor devices, and more specifically, to memory devices.

BACKGROUND

In non-volatile memory devices it is desirable to increase the ratio of a first capacitance, which is between a control gate and a floating gate, to a second capacitance, which is between a floating gate and a substrate. The ratio between the first and second capacitances is known as the gate coupling ratio. By having a high gate coupling ratio smaller peripheries can be used, thus desirably saving chip space.

One way to increase the gate coupling ratio is to enlarge the width of the floating gates in a non-volatile memory. However, increasing the width of the floating gates undesirably increases the size of the non-volatile memory device. In addition, as the width of the floating gates increases spaces between floating gates decreases. The floating gates are typically formed by depositing a conformal layer and then etching the layer to form the floating gates. If the spaces between the floating gates are too small, sub-lithographic processes are used to remove any unwanted portions of the layer to form the spaces. Sub-lithographic processes are expensive and difficult to control in a manufacturing environment. Therefore, a need exists for a manufacturable process to decrease the floating gates size without significantly decreasing the gate coupling ratio.

BRIEF DESCRIPTION OF THE DRAWINGS

The present invention is illustrated by way of example and is not limited by the accompanying figures, in which like references indicate similar elements.

FIG. 3 illustrates the semiconductor device of FIG. 2 after forming discrete elements over the semiconductor device in accordance with an embodiment of the present invention;

FIG. 4 illustrates the semiconductor device of FIG. 2 after forming an interface layer and discrete elements in accordance with another embodiment of the present invention;

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

A semiconductor structure may be formed by providing a semiconductor substrate, forming a tunnel dielectric overlying the semiconductor substrate, forming a floating gate overlying the first tunnel dielectric, forming a plurality of discrete elements over the first floating gate, forming a control dielectric overlying the plurality of pre-formed discrete elements, and forming a control gate overlying the control dielectric. In addition, an interfacial layer may optionally be formed overlying the floating gate, wherein the plurality of discrete elements are formed over the interfacial layer. In one embodiment, the plurality of discrete elements may be formed over the floating gate by providing pre-formed discrete elements, and attaching the pre-formed discrete elements to a surface of the semiconductor substrate, overlying the interfacial layer, if present, and the floating gate. More details and alternative processes and resulting structures can be further understood with reference to the figures.

Figure 1:
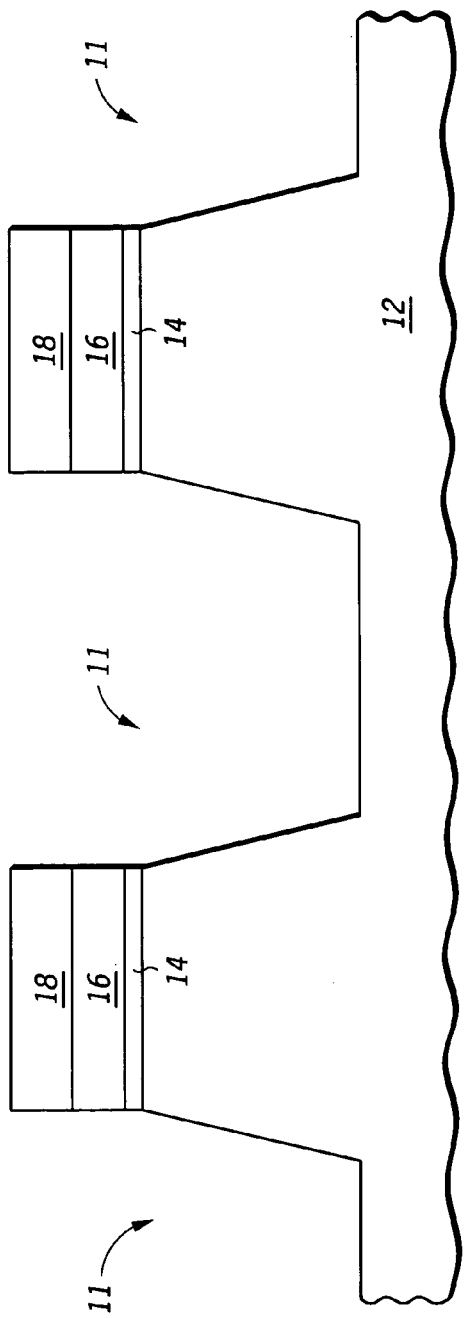
FIG. 1 illustrates a cross-sectional view of a semiconductor device having tunnel dielectrics, floating gates, mask, and (isolation) trenches in accordance with an embodiment of the present invention.

Shown in FIG. 1 is a portion of a semiconductor device 10 (e.g., a non-volatile memory device) having masks 18, floating gates 16, tunnel dielectrics 14, and a semiconductor substrate 12 patterned to form (isolation) trenches 11. The semiconductor substrate 12 can be any semiconductor material or combinations of materials, such as gallium arsenide, silicon germanium, silicon-on-insulator (SOI), silicon, monocrystalline silicon, the like, and combinations of the above. The tunnel dielectrics 14, the floating gates 16, and the masks 18 are formed over the semiconductor substrate 12 prior to forming the trenches 11. The tunnel dielectrics 14 may be silicon dioxide, trap-free silicon nitride, any other suitable insulating material, or combinations of the above formed by thermal growth, thermally assisted diffusion or deposition (e.g., chemical vapor deposition (CVD)), the like or combinations of the above. In one embodiment, the tunnel dielectrics 14 have thicknesses between approximately 5–15 nanometers. Formed over the tunnel dielectrics 14, the floating gates 16 may be polysilicon, a metal (e.g., titanium), any other conductive material (e.g., titanium nitride), or combinations of the above. The floating gates 16 may be formed by any deposition process, such as CVD, and may be approximately 50–200 nanometers thick.

After forming the floating gates 16, masks 18 are deposited over the semiconductor device 10. The masks 18 may include one layer or more than one layer. In one embodiment, the masks 18 may be a hardmask (e.g., nitride) or a photoresist material. The masks 18 are patterned using conventional processes known to a skilled artisan. In one embodiment, the masks 18 are used both to pattern the underlying floating gates 16 and the tunnel dielectrics 14 and to etch the semiconductor substrate 12 to form the trenches 11. In one embodiment, $CF_4$ is used to (dry) etch the floating gates 16, the tunnel dielectrics 14, and the semiconductor substrate 12; however, other chemistries can be used. In another embodiment, a wet etch is performed. The sidewalls of the trenches 11 are illustrated in FIG. 1 as being sloped which is an artifact of the etch process and will differ based on the process used. In one embodiment, the width of the trenches 11 is approximately 100 to 300 nanometers and the depth of the trenches 11 is approximately 200–500 nanometers.

Since the floating gates 16, as shown in FIG. 1, are self aligned to the trenches 11 the distance between the floating gates 16 is large enough so that material between the floating gates 16 can be removed using lithographic processes. In addition, the self alignment avoids other problems that may occur due to the overlapping of the floating gates and the trench 11. Unfortunately, decreasing the width of the floating gates 16 so that the floating gates 16 are self aligned to the trenches 11 decreases the gate coupling ratio. However, as will be described below, the topography of the floating gates' 16 surfaces may be modified to increase the gate coupling ratio by forming discrete elements. Thus, as will become evident the decreased gate coupling ratio due to the floating gate width is offset by the increased gate coupling due to the modification of the topography of the floating gates 16.

The modifications of the topography of the floating gates described below can be used on any floating gate and achieve benefits. Thus, if the floating gate is not self-aligned and instead overlaps the trenches then the topographical modifications will increase the gate coupling ratio.

Figure 2:
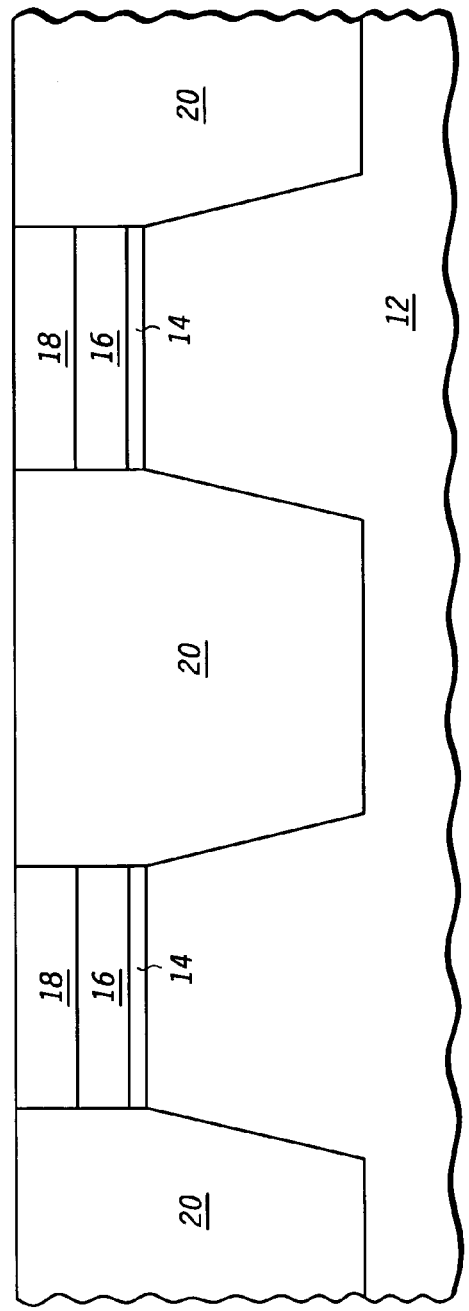
FIG. 2 illustrates the semiconductor device of FIG. 1 after forming trench fill material in the trenches in accordance with an embodiment of the present invention.

After forming the trenches 11, a trench fill material 20 is formed over the semiconductor device 10. In one embodiment, the trench fill material 20 is deposited using CVD, however any other deposition process may be used, such as physical vapor deposition (PVD). The trench fill material 20 may be silicon dioxide, any dielectric, or combinations of the above. In one embodiment, after depositing the trench fill material 20 the trench fill material 20 is made coplanar with the top of the masks 18 using chemical mechanical polishing (CMP), as illustrated in FIG. 2.

After planarizing the trench fill material 20 the masks 18 are removed using conventional techniques. For example, if the masks 18 are a nitride, a wet strip (e.g., phosphoric acid) may be used. Next, discrete elements 22 are formed over the floating gates 16. Discrete elements 22 may be nanoclusters, nanocrystals, discrete storage elements, surface enhancing discrete elements, the like or combinations of the above. The discrete elements 22 may be a semiconductor material (e.g., silicon, germanium, the like or combinations of the above) or a conductive material (e.g., a metal or metal alloy). Thus, the discrete elements 22 are substantially conductive.

The discrete elements 22 are formed spaced apart from each other. In other words, the discrete elements 22 are physically isolated from each other. In one embodiment, the discrete elements 22 are spaced apart at least approximately 10 nanometers on average, or more specifically, approximately 20–40 nanometers on average. The discrete elements 22 may not all be spaced equidistance from each other. For example, a first discrete element 22 may be spaced apart from a second discrete element 22 by approximately 11 nanometers and the second discrete element 22 may be spaced apart from a third discrete element by approximately 9 nanometers, but on average the first, second and third discrete elements 22 are spaced apart at least approximately 10 nanometers.

As shown in FIGS. 3–6, two or more discrete elements 22 may combine with each other to form one large discrete element 23, but all the discrete elements 22 are not in physical contact with each other. In one embodiment, the discrete elements 22 have a diameter between approximately 5 to 30 nanometers. While the discrete elements 22 may vary in diameter, in one embodiment, the variation is no more than 10 percent with respect to a mean diameter.

In one embodiment, the discrete elements 22 are the same material as the floating gates 16 (e.g., silicon), which prevents the formation of discrete elements 22. In other words, when the discrete elements 22 nucleate on a layer made of the same material, the discrete elements 22 will undesirably coalesce and form a continuous layer for energy reasons. Thus, to form the discrete elements 22 on the same material they are made of, the discrete elements nucleate before being in contact with the surface of the floating gates 16. Thus, the discrete elements 22 are pre-formed prior to contacting the floating gates 16. In one embodiment, the discrete elements 22 nucleate in the gas/vapor phase following pyrolysis (i.e., form gas phase nuclei) at high temperatures of a silicon-containing precursor gas. In one embodiment, the precursor used is silane ($SiH_4$). The temperature used should be high enough to decompose the silane into silicon atoms and hydrogen gas in a gaseous phase. The silicon atoms then nucleate in the gas phase and grow by vapor deposition and coagulation. In one embodiment, the silicon nuclei are approximately 5 to 30 nanometers in diameter. In one embodiment, the temperature used is greater than approximately 900 degrees Celsius and the partial pressure of the silicon containing precursor is greater than approximately 0.1 torr. These temperatures are greater than those used in typical low pressure chemical vapor deposition (LPCVD) processes for silicon. After forming the nanocrystals they are attached to the semiconductor device 10 by electrostatic forces; the nuclei are too small for gravity to be the attracting force. The formation, ionization, attachment stages of the depositions process may occur in the same or different chambers or tools. Alternatively, the particles may be thermophoretically deposited on the wafer. Small particles present in a temperature gradient are driven from regions of higher temperature to colder areas. For example, in low pressure environments, gas atoms impinge on a nanoparticle at a higher rate on the hotter side because of their higher kinetic energy and thus drive it to colder areas. This thermophoretic motion may be exploited to deposit nanoparticles from a hot ambient onto the surface of a wafer held at a much lower temperature.

In another embodiment, the discrete elements 22 are a different material than the floating gates 16. For example, the discrete elements 22 may be a metal and the floating gates 16 may be polysilicon or vice versa. To deposit the discrete elements 22 in this embodiment, the nuclei can be formed in the vapor phase prior to attachment as discussed above, by LPCVD where the nuclei are formed on the surface of the floating gates 16, or any other process, such as PVD or atomic layer deposition (ALD). Thus, the discrete elements 22 need not nucleate in a gas phase in this embodiment.

In yet another embodiment, an interfacial layer 17 may be formed over the floating gates 16, as shown in FIG. 4. In one embodiment, the interfacial layer 17 is a dielectric, such as silicon dioxide. In another embodiment, the interfacial layer 17 may be conductive (e.g., a metal or metal alloy). The interfacial layer 17 is preferably a thin layer (e.g., approximately 0.5 to 1 nm) so that it is electrically transparent. If the interfacial layer 17 is thin enough it may coalesce into balls during subsequent high temperature processing, which should not affect the functionality of the semiconductor device 10. The interfacial layer 17 may be formed by CVD, PVD, ALD, diffusion, the like or combinations of the above over the floating gate 16 and patterned using the masks 18, as discussed above with regards to FIGS. 1 and 2. Alternatively, the interfacial layer 17 can be formed after removing the masks 18. In this embodiment, if the interfacial layer 17 is conductive it may be patterned and removed using the masks (not shown) so that it does not electrically couple areas of the semiconductor device 10 that are otherwise electrically isolated from each other by the trench fill material 20. If the interfacial layer 17 is a dielectric it need not be removed. The interfacial layer 17 may be present to form a layer that is a different material than that the discrete elements 22 and the floating gates 16 so that deposition of nanocrystals via LPCVD can be used; this is cheaper than depositing the discrete elements 22 where each nucleus is formed in the gas phase prior to its contact with the floating gate 16. For example, if floating gates 16 and discrete elements 22 comprise silicon, layer 17 can be silicon dioxide or silicon nitride.

In another embodiment, prefabricated discrete elements 22 may be deposited on the semiconductor device 10 by wetting the semiconductor device in a colloidal solution. The colloidal solution may include a solvent and prefabricated discrete elements. In one embodiment, a wetting promoter is added to the colloidal solution to encourage uniform distribution of the colloidal solution.

In the embodiments discussed above in regards to FIGS. 3 and 4, the discrete elements 22 modify the topography of the floating gates 16 by increasing the net surface area. Because the interfacial layer 17, if present, is thin, the discrete materials 22 are not electrically isolated from the floating gate if the interfacial layer 17 is a dielectric. If the interfacial layer 17 is a metal the floating gates are also not electrically isolated from the floating gates 16 and instead, are coupled to the floating gates 16 via the interfacial layer 17. By increasing the net surface area of the floating gates 16 the gate coupling ratio is increased.

As illustrated in FIGS. 3–4, the discrete elements 22 are formed over the floating gates 16 and the trenches 11 that are filled with trench fill material 20. There is no need to remove the discrete elements 22 over the trench fill material 20 since the discrete elements 22 do not couple or short the floating gates 16 to each other. In other words, since the discrete elements 22 are physically isolated from each other processing is simplified by eliminating a patterning process that would be needed if the discrete elements 22 over the floating gates 16 were coupled to each other. If a continuous layer, for example, was used instead of the discrete elements 22 a patterning process would be needed to remove portions of the continuous layer that are formed over the trench fill material 20 so that the floating gates 16 did not short together.

Figure 5:
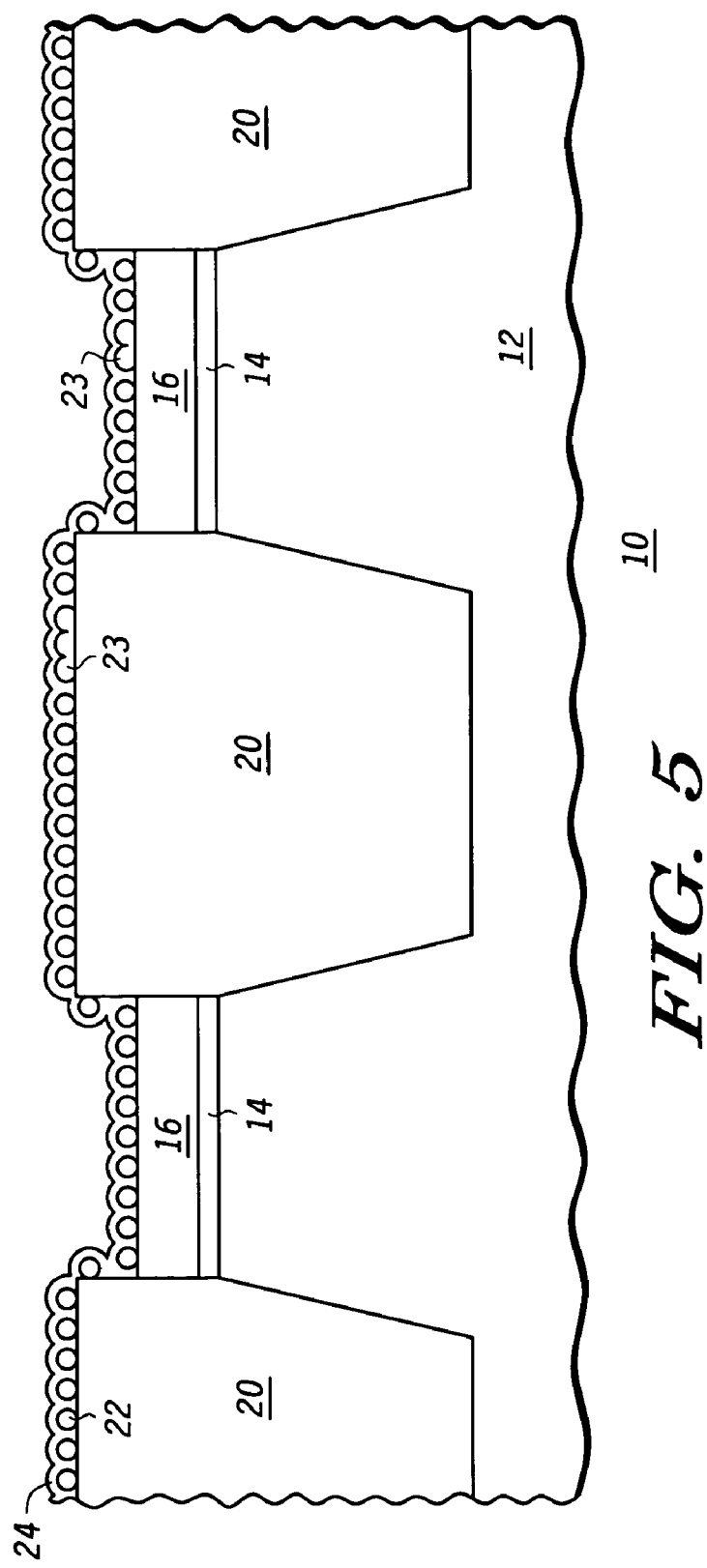
FIG. 5 illustrates the semiconductor device of FIG. 3 after forming a control dielectric in accordance with an embodiment of the present invention.
Figure 6:
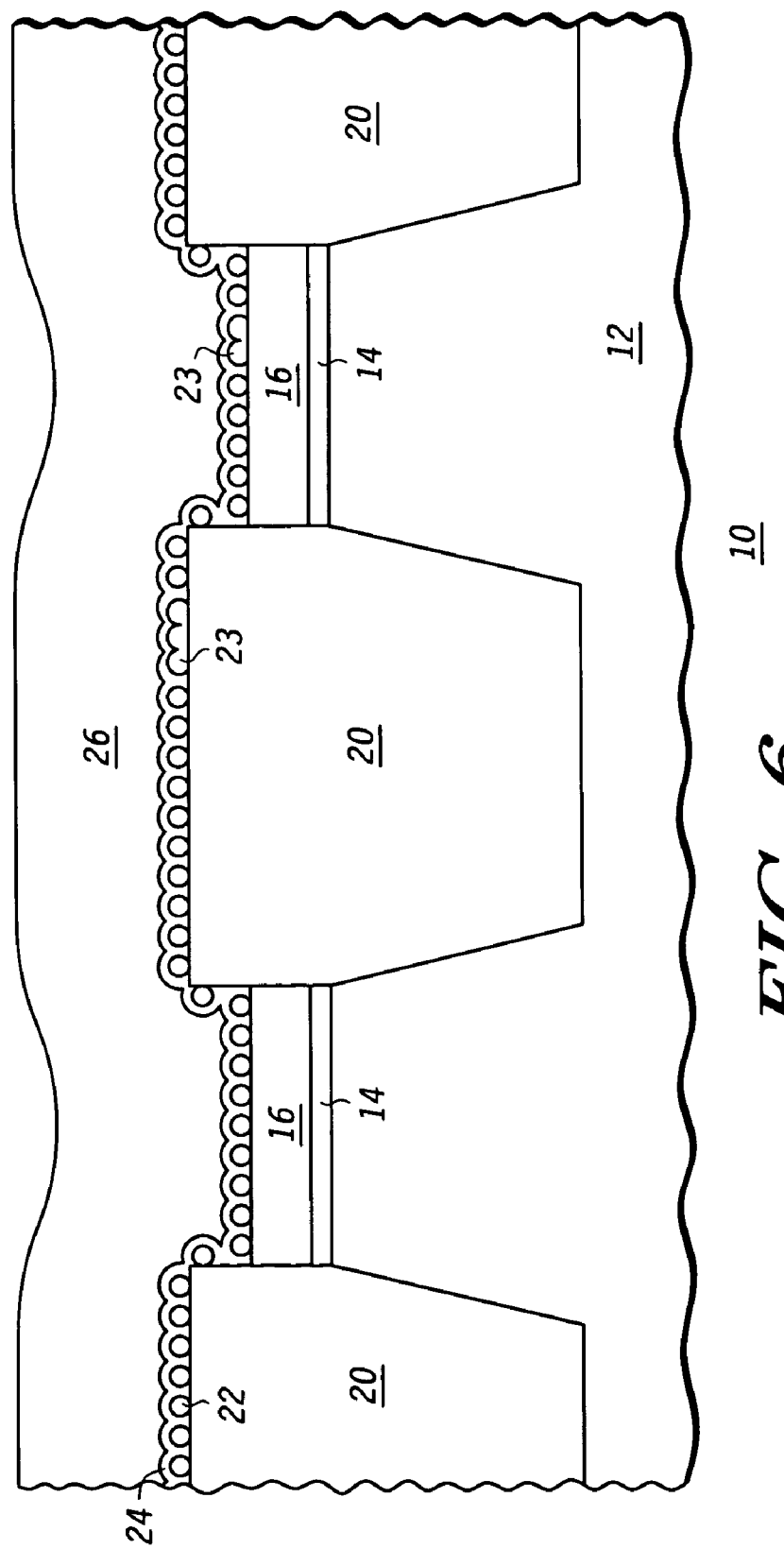
FIG. 6 illustrates the semiconductor device of FIG. 5 after forming a control gate in accordance with an embodiment of the present invention.

After forming the discrete elements 22, a control dielectric 24 is formed over the discrete elements 22, as shown in FIG. 5. Due to the spaces between the discrete elements 22, portions of the control dielectric 24 will be formed between the discrete elements 22. The control dielectric 24 will probably have a nonplanar topography due to the presence of the underlying discrete elements 22. In one embodiment, the control dielectric 24 may be an insulating or dielectric layer or stack of layers. For example, the control dielectric 24 may be an oxide-nitride-oxide (ONO) stack (where, in one embodiment, the oxides are silicon dioxide and the nitride is silicon nitride) or a high-k (high dielectric constant) material. As used herein, a high-k material is a material with a dielectric constant greater than that of silicon dioxide. The control dielectric 24 may be formed by deposition (e.g., CVD, PVD, ALD, the like or combinations of the above), thermal oxidation, the like, or combinations of the above.

After forming the control dielectric 24, a control electrode (control gate) 26 is formed over the semiconductor device 10. In one embodiment, the control electrode 26 is polysilicon, metal, any other conductive material, or combinations of the above. The control electrode 26 may be formed by CVD, PVD, ALD, the like or combinations of the above. Conventional processing as known to a skilled artisan can be performed after forming the control electrode 24.

By now it should be appreciated that there has been provided a manufacturable process to decrease the floating gates size without significantly decreasing the gate coupling ratio. The spaces between the floating gates are large enough to be removed using manufacturable processes and the altered topography of the floating gates will increase the gate coupling ratio of the devices.

In the foregoing specification, the invention has been described with reference to specific embodiments. However, one of ordinary skill in the art appreciates that various modifications and changes can be made without departing from the scope of the present invention as set forth in the claims below. For example, the floating gates 16 need not be self aligned to the trenches 11. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms "a" or "an", as used herein, are defined as one or more than one. Moreover, the terms "front", "back", "top", "bottom", "over", "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein. The term "plurality", as used herein, is defined as two or more than two. The term "another", as used herein, is defined as at least a second or more. The term "coupled", as used herein, is defined as connected, although not necessarily directly, and not necessarily mechanically.

What is claimed is:

1. A method for forming a semiconductor structure, comprising:
   providing a semiconductor substrate;
   forming a first tunnel dielectric overlying the semiconductor substrate;
   forming a first floating gate overlying the first tunnel dielectric;
   depositing a plurality of pre-formed discrete elements in contact with the first floating gate;
   forming a control dielectric overlying the plurality of pre-formed discrete elements; and
   forming a control gate overlying the control dielectric.

2. The method of claim 1, further comprising:
   forming an isolation trench in the semiconductor substrate;
   filling the isolation trench with a trench fill material;
   forming a second tunnel dielectric overlying the semiconductor substrate; and
   forming a second floating gate overlying the second tunnel dielectric, wherein the trench fill material is between the first floating gate and the second floating gate.

3. The method of claim 2, wherein depositing the plurality of pre-formed discrete elements over the first floating gate further comprises depositing the plurality of pre-formed discrete elements over the trench fill material and the second floating gate.

4. The method of claim 3, wherein forming the control dielectric is performed such that the control dielectric overlies the plurality of pre-formed discrete elements overlying the first floating gate, the trench fill material, and the second floating gate.

5. The method of claim 1, wherein the first floating gate comprises polysilicon.

6. The method of claim 1, wherein the first floating gate comprises metal.

7. The method of claim 1, wherein forming the control dielectric comprises forming an oxide layer overlying the plurality of pre-formed discrete elements and forming a nitride layer overlying the oxide layer.

8. The method of claim 1, wherein forming the control dielectric comprises forming a dielectric layer having a high dielectric constant overlying the plurality of pre-formed discrete elements.

9. The method of claim 1, wherein the plurality of pre-formed discrete elements are further characterized as pre-fabricated discrete elements.

10. The method of claim 1, wherein the plurality of pre-formed discrete elements comprise nanocrystals.

11. The method of claim 1, wherein the plurality of pre-formed discrete elements comprise discrete storage elements.

12. The method of claim 1, wherein each of the plurality of pre-formed discrete elements comprise a substantially conductive material.

13. The method of claim 1, wherein after depositing the plurality of pre-formed discrete elements, each of the plurality of pre-formed discrete elements is spaced apart from each other by at least 10 nanometers on average.

14. A method for forming a semiconductor structure, comprising:
   providing a semiconductor substrate;
   forming a first tunnel dielectric overlying the semiconductor substrate;
   forming a first floating gate overlying the first tunnel dielectric;
   forming a plurality of discrete elements on the first floating gate, wherein the plurality of discrete elements are in contact with the first floating gate;
   forming a control dielectric overlying the plurality of discrete elements; and
   forming a control gate overlying the control dielectric.

15. The method of claim 14, further comprising:
   forming an isolation trench in the semiconductor substrate;
   filling the isolation trench with a trench fill material;
   forming a second tunnel dielectric overlying the semiconductor substrate;
   forming a second floating gate overlying the second tunnel dielectric; and
   forming a first interfacial layer overlying the second floating gate, wherein the trench fill material is between the first floating gate and the second floating gate.

16. The method of claim 15, wherein forming the plurality of discrete elements on the first floating gate further comprises depositing the plurality of discrete elements over the trench fill material and the first interfacial layer.

17. The method of claim 16, wherein forming the control dielectric is performed such that the control dielectric overlies the plurality of discrete elements on the first floating gate, the trench fill material, and the second floating gate.

18. The method of claim 14, wherein the first floating gate comprises one of polysilicon and metal.

19. The method of claim 14, wherein the plurality of discrete elements comprise nanocrystals.

20. The method of claim 14, wherein the plurality of discrete elements comprise discrete storage elements.

21. The method of claim 14, wherein each of the plurality of discrete elements comprise a substantially conductive material.

22. The method of claim 14, wherein forming the plurality of discrete elements on the first floating gate is performed using a process selected from the group consisting of low pressure chemical vapor deposition (LPCVD), physical vapor deposition (PVD), and atomic layer deposition (ALD).

23. The method of claim 14, wherein after depositing the plurality of discrete elements, each of the plurality of discrete elements is spaced apart from each other by at least 10 nanometers on average.

24. The method of claim 14, wherein the plurality of discrete elements are pre-formed.

25. A method for forming a semiconductor structure, comprising:
   providing a semiconductor substrate;
   forming a first tunnel dielectric overlying the semiconductor substrate;
   forming a first floating gate overlying the first tunnel dielectric;
   depositing a plurality of pre-formed discrete elements over the first floating gate, wherein
      depositing the plurality of pre-formed discrete elements over the first floating gate comprises:
         forming at least one of the plurality of pre-formed discrete elements during a gas phase nucleation, and
         after forming the at least one of the plurality of pre-formed discrete elements, attaching the at least one of the plurality of pre-formed discrete elements to a surface of the semiconductor substrate over the first floating gate;
   forming a control dielectric overlying the plurality of pre-formed discrete elements; and
   forming a control gate overlying the control dielectric.

26. The method of claim 25, wherein the gas phase nucleation is performed in a first chamber and the attaching is performed in a second chamber.

27. The method of claim 26, wherein the attaching is performed using forces selected from the group consisting of electrostatic forces and thermophoretic forces.

* * * * *